United States Patent
Shi et al.

(10) Patent No.: US 6,277,505 B1
(45) Date of Patent: Aug. 21, 2001

(54) READ SENSOR WITH IMPROVED THERMAL STABILITY AND MANUFACTURING METHOD THEREFOR

(75) Inventors: Zhupei Shi, San Jose; Ming Mao, Pleasanton; Qunwen Leng, San Jose, all of CA (US)

(73) Assignee: Read-Rite Corporation, Milpitas, CA (US)

( * ) Notice: Subject to any disclaimer, the term of this patent is extended or adjusted under 35 U.S.C. 154(b) by 0 days.

(21) Appl. No.: 09/234,953

(22) Filed: Jan. 21, 1999

(51) Int. Cl.$^7$ ........................................ B32B 9/00
(52) U.S. Cl. .................. 428/692; 427/131; 427/132; 428/693; 428/702; 428/900
(58) Field of Search .................. 428/692, 693, 428/702, 900; 427/131, 132

(56) References Cited

U.S. PATENT DOCUMENTS

| | | |
|---|---|---|
| 5,206,590 | 4/1993 | Dieny et al. ........................ 324/252 |
| 5,287,238 | 2/1994 | Baumgart et al. .................. 360/113 |
| 5,465,185 | 11/1995 | Heim et al. ......................... 360/113 |
| 5,889,640 | * 3/1999 | Hayashi et al. . |

OTHER PUBLICATIONS

Dieny, B. et al. "Giant Magnetoresistance in Soft Ferromagnetic Multilayers", Physical Review B, vol. 43, No. 1, Jan. 1, 1991, pp. 1297–1300.

\* cited by examiner

*Primary Examiner*—Bernard Pianalto
(74) *Attorney, Agent, or Firm*—Mikio Ishimaru

(57) ABSTRACT

A structure which includes a ferromagnetic (FM) layer, a thin oxide layer, and an antiferromagnetic (AFM) layer is provided. The thin oxide layer, between 1 to 10 oxygen atoms in thickness, minimizes interlayer atomic diffusion between the FM layer and the antiferromagnetic layer. In a preferred embodiment, a spin valve sensor with improved thermal stability is provided by including the thin oxide layer between a FM layer and an AFM layer. The presence of the thin oxide layer also results in an improved spin valve sensor with an enhanced exchange pinning field.

19 Claims, 2 Drawing Sheets

READ SENSOR WITH IMPROVED THERMAL STABILITY AND MANUFACTURING METHOD THEREFOR

TECHNICAL FIELD

The present invention relates generally to bilayer structures formed of ferromagnetic and antiferromagnetic materials and more specifically to magnetic sensors for reading information signals recorded in a magnetic medium.

BACKGROUND ART

A large portion of the data storage in today's computers is done on magnetic media such as magnetic disks. Data is presented to a computer by huge quantities of bits (ones and zeroes) and stored on magnetic disks where each bit is represented by an induced magnetic field. In order to read the value of any given bit, a sensor able to detect changes in a magnetic field is required.

To this end, a sensor that changes electrical resistance in response to a magnetic field, called a magnetoresistive (MR) sensor, is employed. Most sensors utilize the anisotropic magnetoresistive (AMR) effect where a read element resistance varies in proportion to the square of the cosine of the angle between the magnetization in the read element and the direction of a sense current flowing through the read element. Data is read by the sensor from magnetic transitions recorded in the media. The magnetic field, resulting from a transition, causes a change in the direction of the magnetization in the read element. The new magnetization direction changes the resistance of the read element with a corresponding change in the sense current or voltage.

Newer sensors, which are more sensitive to smaller recorded transitions on higher density media, are starting to become more commonly used. These sensors use a larger form of magnetoresistance called the giant magnetoresistance (GMR) effect. The GMR effect produces a magnetoresistance that, for selected combinations of materials is greater in magnitude than that of the AMR effect. The GMR effect occurs in multilayer thin films of alternating ferromagnetic and nonferromagnetic metals. The resistance of a GMR film changes according to the cosine of angle between the magnetization of the ferromagnetic (FM) layers.

A subset of the GMR devices is the spin valve in which two ferromagnetic layers, a "free" layer and a "pinned" layer, are used as explained in B. Dieny, et al. "Giant Magnetoresistance in Soft Ferromagnetic Multilayers", Physical Review B., Vol. 43, No. 1, Jan. 1, 1991, pp. 1297–1300 and Dieny, et al. U.S. Pat. No. 5,206,590. When the magnetization in the two layers are aligned, the resistance is at a minimum. When the magnetizations are antialigned, the resistance is at a maximum. The resistance varies as the cosine of the angle between the magnetizations and is independent of the direction of current flow. The magnetization of the pinned layer is held in place by depositing it next to a layer of antiferromagnetic (AFM) material with a resulting exchange coupling of the two layers. The free layer magnetization is free to rotate in response to the field from the disk. In this way, the magnetization swings between being parallel (low resistance state) to anti-parallel (high resistance state) as the head flies over recorded magnetic transitions on the disk. The resulting change in electrical resistance arising from the GMR effect is sensed and the magnetic information on the disk is transformed into electrical signals. Commonly used metallic AFM materials are platinum manganese (PtMn), iron manganese (FeMn), iridium manganese (IrMn), nickel manganese (NiMn), and nickel oxide (NiO).

Unfortunately, the current incarnations of giant magnetoresistive (GMR) sensors using the spin valve effect have a significant problem which is directly related to the FM/AFM (or pinned/pinning) bilayer of the GMR sensor. When subjected to either high temperature annealing or long term high current density operation, interlayer atomic diffusion at the bilayer interface occurs and causes operational instability of the GMR sensor due to the degradation of both the pinning field and the pinning angle of the bilayer. This thermal degradation is a serious problem since thermal annealings of up to 250° C. are required in the process of device fabrication for curing organic insulators coated on metal surfaces of the GMR sensors. Besides, the GMR sensor itself is expected to undergo long-term operation under a high current density. A solution, which would form an FM/AFM bilayers for GMR sensor with improved thermal stability, has long been sought but has eluded those skilled in the art.

DISCLOSURE OF THE INVENTION

The present invention provides a bilayer structure of a ferromagnetic (FM) layer and an antiferromagnetic (AFM) layer with improved thermal stability.

The present invention also provides a spin valve sensor with improved thermal stability by including a thin oxide layer between a FM layer and an AFM layer.

The present invention further provides an improved spin valve sensor with an enhanced exchange pinning field.

The present invention provides a method for forming a thin oxide layer on an AFM layer prior to the formation of a FM layer in a spin valve sensor to minimize interlayer atomic diffusion between the AFM layer and the FM layer.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
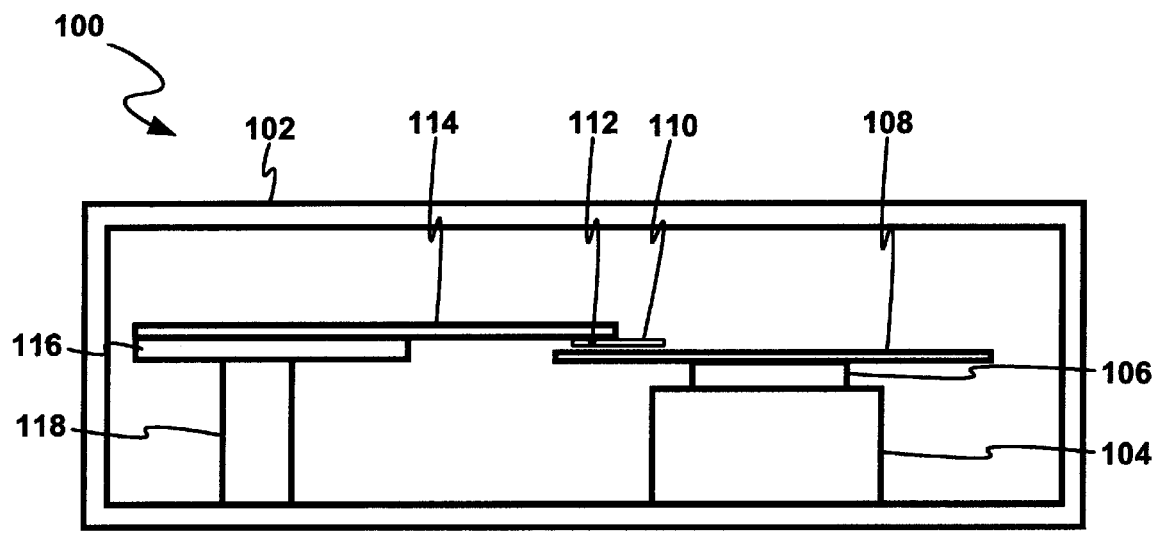
FIG. 1A (PRIOR ART) is a side view schematic of a magnetic recording disk drive.

Referring now to FIG. 1A (PRIOR ART), therein is shown a magnetic recording disk drive system 100. The system 100 has a housing 102 on which a disk drive motor 104 is mounted. The disk drive motor 104 is a high-speed motor having a hub 106 on which one or more magnetic recording disks, such as the magnetic recording disk 108, is mounted.

The magnetic recording disk 108 is generally covered by a lubricant to minimize friction during start-up conditions. During operation, a film of air on the rotating magnetic recording disk 108 lifts an air-bearing slider 110 away from the surface of the disk 108. A read/write transducer 112 is mounted to the air-bearing slider 110.

The read/write transducer 112 includes a conventional giant magnetoresistive (GMR) or spin valve sensor.

The air-bearing slider 110 and the read/write transducer 112 are held by a suspension arm 114 which provides a spring action to hold the air-bearing slider 110 within a specified range of distances from the surface of the disk 108. The suspension arm 114 is supported by an arm 116 which is rotated by an actuator 118. As the disk drive motor 104 rotates the disk 108, the actuator 118 moves the read/write transducer 112 radially with respect to the surface of the disk 108 to access different data tracks thereon.

Figure 1B:
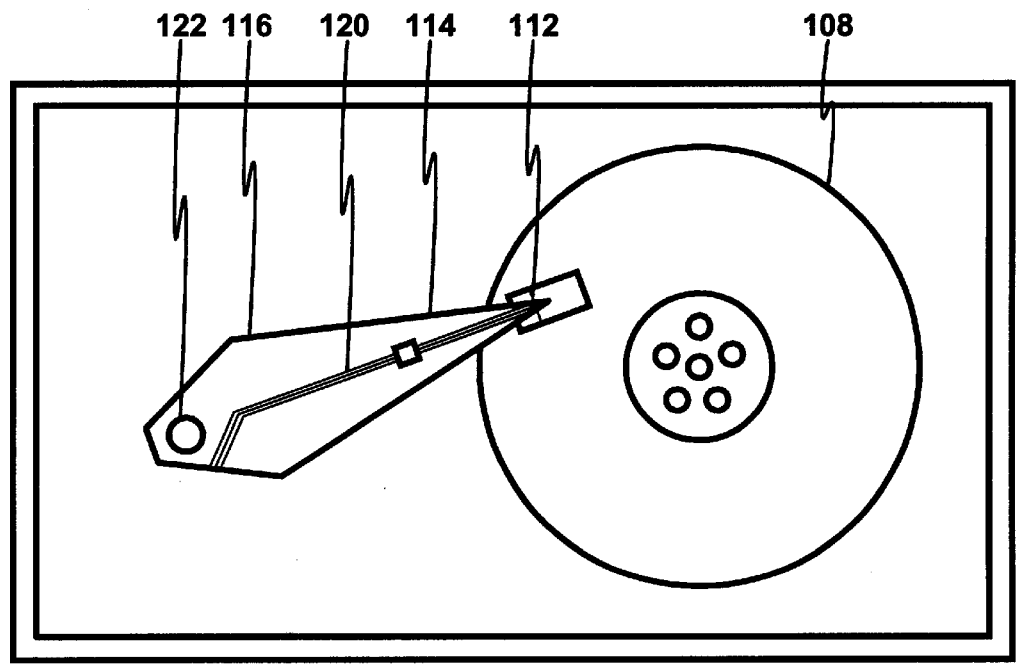
FIG. 1B (PRIOR ART) is a simplified top view of the system as shown in FIG. 1A (PRIOR ART)

Referring now to FIG. 1B (PRIOR ART), therein is shown the top view of the system 100 with the transducer 112 at the end of the suspension 114 and connected by wires 120 to a read/write circuitry (not shown). A pivot 122 allows the arm 116 to turn in order to read/write to various tracks on the disk 108.

Figure 2:
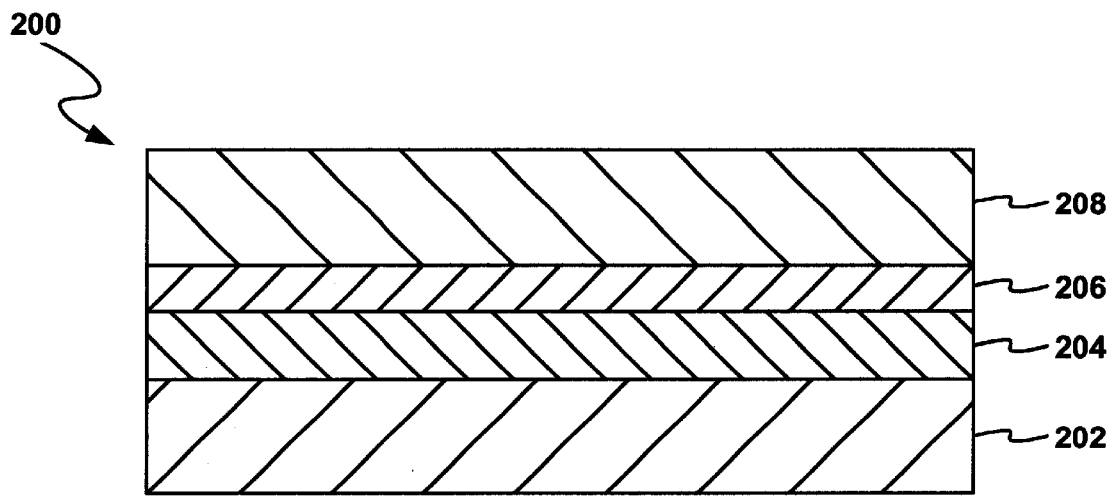
FIG. 2 (PRIOR ART) is a cross-sectional view of the layers in a prior art spin valve sensor.

Referring now to FIG. 2 (PRIOR ART), therein is shown a cross-section of a conventional single spin valve sensor 200. The spin valve sensor 200 includes a pinning layer 202 that is formed of an antiferromagnetic (AFM) material. On top of the pinning layer 202 is a pinned layer 204 that is formed of a ferromagnetic (FM) material. A nonmagnetic spacer layer 206 that is formed of a nonmagnetic material, such as copper, is disposed atop the pinned layer 204. On top of the nonmagnetic spacer layer 206 is a free layer 208 that is formed of a ferromagnetic material.

Figure 3:
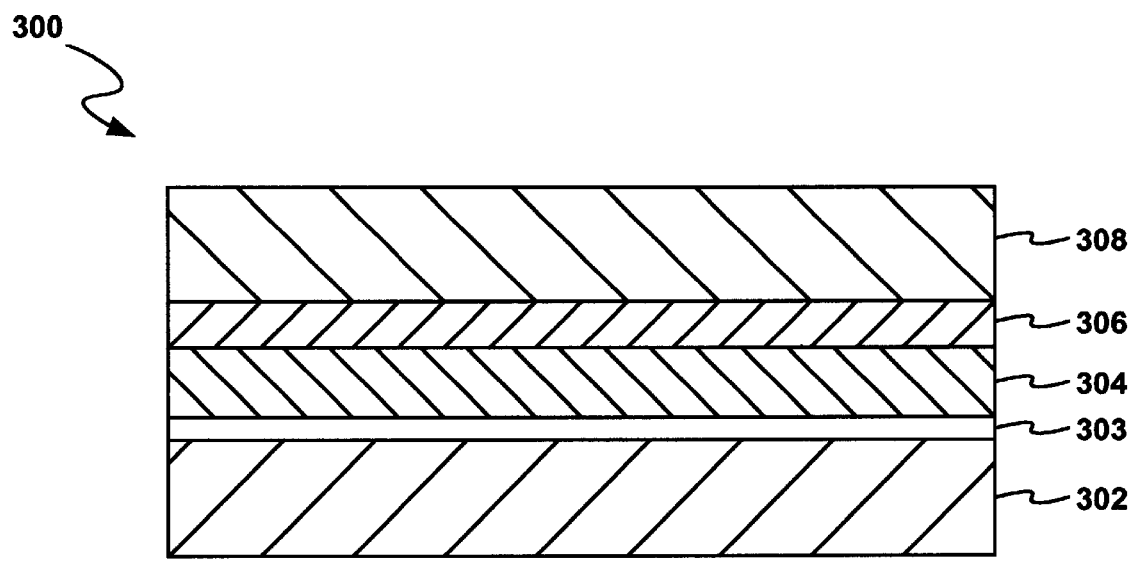
FIG. 3 is a cross-sectional view of the layers in a spin valve sensor constructed in accordance with the present invention.

Referring now to FIG. 3, therein is shown a cross-section of a single spin valve sensor 300 formed in accordance of the present invention. The spin valve sensor 300 includes a pinning layer 302 that is formed of an antiferromagnetic (AFM) material. The pinning (AFM) layer 302 includes a material selected from the group consisting of Group VIII materials, a combination thereof, a compound thereof, and an alloy thereof. In a preferred embodiment, the AFM layer 302 includes a material selected from the group consisting of FeMn, IrMn, MnPt, PdPtMn, NiMn, TbCo, FeRh-Ir, a combination thereof, a compound thereof, and an alloy thereof. A thin oxide layer 303 is disposed atop the AFM layer 302. On top of the thin oxide layer 303 is a pinned layer 304 that is formed of a ferromagnetic (FM) material. The pinned (FM) layer 304 includes a material selected from the group consisting of Group VIII materials, a combination thereof, a compound thereof, and an alloy thereof. In a preferred embodiment, the FM layer 304 includes a material selected from the group consisting of NiFe, CoFe, Co, Fe, a combination thereof, a compound thereof, and an alloy thereof.

A nonmagnetic spacer layer 306 that is formed of a nonmagnetic material, such as copper, is disposed atop the pinned layer 304. On top of the nonmagnetic spacer layer 306 is a free layer 308 that is formed of a ferromagnetic material. The free layer 308 includes a material selected from the group consisting of Group VIII materials, a combination thereof, a compound thereof, and an alloy thereof.

As explained in the BACKGROUND ART, one of the problems associated with the prior art MR or spin valve sensor is the high susceptibility of the AFM/FM interface to thermal degradation. When exposed to high temperature annealing or long term high current density operation, interlayer atomic diffusion between the AFM layer 202 and the FM layer 204 (FIG. 2 (PRIOR ART)) occurs. Possible consequences of such diffusion include a reduction of the exchange pinning field intensity and a change in the pinning angle from the desired angle, both of which can cause undesirable operational instability of the read/write transducer 112. Because device fabrication requires high temperature annealing, all spin valves are already highly vulnerable to interlayer diffusion. In addition, since the sensor itself is expected to sustain a high current density during normal device usage, interlayer diffusion is even more likely to occur. Thus thermal degradation is a critical issue in device yield and performance.

The present invention minimizes thermal degradation of the spin valve sensor 300 by providing a thin oxide layer 303 between the AFM layer 302 and the FM layer 304 (FIG. 3). The thin oxide layer 303 has a thickness of about 1 to 5 monoatomic layers. In a preferred embodiment, the thin oxide layer 303 has a thickness of about 1 to 5 times the diameter of an oxygen atom. The thin oxide layer 303 functions as a physical barrier to minimize the interlayer atomic diffusion between the AFM layer 302 and the FM layer 304. It should be noted that if the thin oxide layer 303 is of a thickness of greater than 10 times the diameter of an oxygen atom, it may cause the AFM layer 302 and the FM layer 304 to decouple. This decoupling may result in a significant performance degradation of the spin valve sensor 300.

In addition, the thin oxygen layer 303 also mediates the magnetic interaction between $3d$ transition metals. Because both the AFM layer 302 and the FM layer 304 are commonly formed of $3d$ transition metals, the oxygen atoms in the thin oxygen layer 303 would enhance the coupling between the AFM and FM layers resulting in an improved exchange pinning field. An improved exchange pinning field would improve the performance of the spin valve sensor 300.

The spin valve 300 with a thin oxide layer 303 retains the advantages of conventional spin valve sensor while greatly easing concerns about thermal degradation by both strengthening the exchange pinning field and eliminating the complications and problems associated with interlayer atomic diffusion.

In production of the spin valve sensor 300 in accordance with the present invention, the AFM layer 302 is formed using conventions techniques in a vacuum environment. The vacuum environment is at a pressure that is between about $1\times10^{-9}$ Torr to about $1\times10^{-8}$ Torr. Thereafter, the AFM layer 302 is kept in the vacuum environment for a period of time to allow the formation of the thin oxide layer 303 on the AFM layer 302. In a preferred embodiment, the time taken to form the thin oxide layer 303 to the desired thickness is between about 20 to 40 second at a pressure that is between about $1\times10^{-9}$ Torr to about $1\times10^{-8}$ Torr.

Next, the FM layer 304 is formed on the thin oxide layer 303 using conventional techniques. Thereafter, the nonmagnetic layer 306 and the free layer 308 is successively formed over the FM layer 304 using conventional techniques, thereby completing the formation of the spin valve sensor 300.

By providing a thin oxide layer between the AFM layer and the FM layer in a spin valve sensor, the present invention minimizes thermal degradation of the spin valve sensor. In addition, the thin oxygen layer also enhances the coupling between the AFM and FM layers and results in an improved exchange pinning field and therefore an improvement in the performance of the spin valve sensor.

While the present invention has been described in conjunction with a specific best mode, it is to be understood that many alternatives, modifications, and variations will be apparent to those skilled in the art in light of the aforegoing description. The present invention is applicable to any device possessing which involves a FM/AFM bilayer interface, including both single and dual spin valve sensors, and spin valve sensor with or without synthetic pinned layers. For example, the present invention can be used in systems using tapes, floppy discs, and other magnetic media in addition to magnetic disks. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A bilayer structure, comprising:
   a ferromagnetic layer;
   an antiferromagnetic layer; and
   a thin oxide layer having a thickness less than about ten times the diameter of an oxygen atom and disposed between said ferromagnetic layer and said antiferromagnetic layer, wherein said antiferromagnetic layer comprises a material selected from the group consisting of FeMn, IrMn, MnPt, PdPtMn, NiMn, TbCo, FeRh—Ir, a combination thereof, a compound thereof, and an alloy thereof.

2. The bilayer structure as claimed in claim 1 wherein said ferromagnetic layer comprises a material selected from the group consisting of Group VIII materials, a combination thereof, a compound thereof, and an alloy thereof.

3. The bilayer structure as claimed in claim 1 wherein said ferromagnetic layer comprises a material selected from the group consisting of NiFe, CoFe, Co, Fe, a combination thereof, a compound thereof, and an alloy thereof.

4. The bilayer structure as claimed in claim 1 wherein said ferromagnetic layer includes a magnetization, said antiferromagnetic layer is capable of pinning said magnetization in a predetermined direction.

5. The bilayer structure as claimed in claim 1 wherein said thin oxide layer includes an oxygen layer with a thickness of about one to five times the diameter of an oxygen atom.

6. A bilayer structure, comprising:
   a ferromagnetic layer;
   an antiferromagnetic layer; and
   a thin oxide layer having a thickness less than about ten times the diameter of an oxygen atom and disposed between said ferromagnetic layer and said antiferromagnetic layer, said thin oxide layer operable to minimize thermal degradation of the bilayer structure due to interlayer atomic diffusion between said ferromagnetic layer and said antiferromagnetic layer and to enhance a coupling between said ferromagnetic layer and said antiferromagnetic layer.

7. A spin valve sensor, comprising:
   a first ferromagnetic layer, said first ferromagnetic layer includes a magnetization;
   an antiferromagnetic layer, said antiferromagnetic layer is capable of pinning said magnetization in a predetermined direction; and
   a thin oxide layer having a thickness of less than about ten times the diameter of an oxygen atom and disposed between said first ferromagnetic layer and said antiferromagnetic layer, said thin oxide layer operable to minimize thermal degradation of the spin valve sensor due to interlayer atomic diffusion between said first ferromagnetic layer and said antiferromagnetic layer and to enhance a coupling between said first ferromagnetic layer and said antiferromagnetic layer.

8. A spin valve sensor, comprising:
   a first ferromagnetic layer, said first ferromagnetic layer includes a magnetization;
   an antiferromagnetic layer, said antiferromagnetic layer is capable of pinning said magnetization in a predetermined direction; and
   a thin oxide layer having a thickness less than about ten times the diameter of an oxygen atom and disposed between said first ferromagnetic layer and said antiferromagnetic layer, wherein said antiferromagnetic layer comprises a material selected from the group consisting of FeMn, IrMn, MnPt, PdPtMn, NiMn, TbCo, FeRh—Ir, a combination thereof, a compound thereof, and an alloy thereof.

9. The spin valve sensor as claimed in claim 8 wherein said first ferromagnetic layer comprises a material selected from the group consisting of Group VIII materials, a combination thereof, a compound thereof, and an alloy thereof.

10. The spin valve sensor as claimed in claim 8 wherein said first ferromagnetic layer comprises a material selected from the group consisting of NiFe, CoFe, Co, Fe, a combination thereof, a compound thereof, and an alloy thereof.

11. The spin valve sensor as claimed in claim 10 wherein said nonmagnetic spacer layer comprises copper, and said second ferromagnetic layer comprises a material selected from the group consisting of Group VIII materials, a combination thereof, a compound thereof, and an alloy thereof.

12. The spin valve sensor as claimed in claim 8 further comprising a nonmagnetic spacer layer formed over said first ferromagnetic layer and a second ferromagnetic layer formed over said nonmagnetic spacer layer.

13. The spin valve sensor as claimed in claim 8 wherein said thin oxide layer includes an oxygen layer with a thickness of about one to five times the diameter of an oxygen atom.

14. A spin valve sensor, comprising:
   a first ferromagnetic layer, said first ferromagnetic layer includes a magnetization, wherein said first ferromagnetic layer comprises a material selected from the group consisting of Group VIII materials, a combination thereof, a compound thereof, and an alloy thereof;
   an antiferromagnetic layer, said antiferromagnetic layer is capable of pinning said magnetization in a predetermined direction, wherein said antiferromagnetic layer comprises a material selected from the group consisting of FeMn, IrMn, MnPt, PdPtMn, NiMn, TbCo, FeRh—Ir, a combination thereof, a compound thereof, and an alloy thereof; and
   a thin oxide layer disposed between said first ferromagnetic layer and said antiferromagnetic layer, wherein said thin oxide layer has a thickness of less than about ten times the diameter of an oxygen atom.

15. The spin valve sensor as claimed in claim 14 further comprising:
   a nonmagnetic spacer layer formed over said first ferromagnetic layer, wherein said nonmagnetic spacer layer comprises copper; and
   a second ferromagnetic layer formed over said nonmagnetic spacer layer, wherein said second ferromagnetic layer comprises a material selected from the group consisting of Group VIII materials, a combination thereof, a compound thereof, and an alloy thereof.

16. A method for forming a spin valve sensor, comprising:
   providing an antiferromagnetic layer, said antiferromagnetic layer including a material selected from the group consisting of FeMn, IrMn, MnPt, PdPtMn, NiMn, TbCo, FeRh—Ir, a combination thereof, a compound thereof, and an alloy thereof;
   forming a thin oxide layer to a thickness of less than about ten times the diameter of an oxygen atom on said antiferromagnetic layer; and
   forming a ferromagnetic layer on said thin oxide layer, said ferromagnetic layer includes a magnetization, wherein said antiferromagnetic layer is capable of pinning said magnetization in a predetermined direction.

17. The method as claimed in claim 16 wherein said thin oxide layer has a thickness of about 1 to 5 times the diameter of an oxygen atom.

18. The method as claimed in claim 16 wherein the step of forming said thin oxide layer is performed at a pressure that is between about $1 \times 10^{-9}$ Torr to about $1 \times 10^{-8}$ Torr.

19. The method as claimed in claim 18 wherein the step of forming said thin oxide layer is performed at said pressure for a period of between about 20 to 40 seconds.

* * * * *